United States Patent
Kita

(10) Patent No.: US 8,530,291 B2
(45) Date of Patent: Sep. 10, 2013

(54) METHOD FOR MANUFACTURING DISPLAY DEVICE

(75) Inventor: Makoto Kita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 187 days.

(21) Appl. No.: 13/144,380

(22) PCT Filed: Aug. 17, 2009

(86) PCT No.: PCT/JP2009/003914
§ 371 (c)(1),
(2), (4) Date: Jul. 13, 2011

(87) PCT Pub. No.: WO2010/086920
PCT Pub. Date: Aug. 5, 2010

(65) Prior Publication Data
US 2011/0287565 A1   Nov. 24, 2011

(30) Foreign Application Priority Data
Jan. 30, 2009   (JP) ................................. 2009-019375

(51) Int. Cl.
*H01L 21/00* (2006.01)
(52) U.S. Cl.
USPC ........................................................ 438/179

(58) Field of Classification Search
None
See application file for complete search history.

(56) References Cited

U.S. PATENT DOCUMENTS

| 8,035,103 B2 * | 10/2011 | Kimura ........................... 257/59 |
| 2009/0250701 A1 | 10/2009 | Kimura |
| 2010/0014031 A1 | 1/2010 | Kikuchi et al. |

FOREIGN PATENT DOCUMENTS

| EP | 709718 A2 | 5/1996 |
| JP | H6-318577 A | 11/1994 |
| JP | 7-130701 A | 5/1995 |
| JP | 8-122821 A | 5/1996 |
| JP | 2001-005028 A | 1/2001 |
| WO | 2007/017982 A1 | 2/2007 |
| WO | 2008/072423 A1 | 6/2008 |

* cited by examiner

*Primary Examiner* — Charles Garber
*Assistant Examiner* — Andre' C Stevenson
(74) *Attorney, Agent, or Firm* — Chen Yoshimura LLP

(57) ABSTRACT

Exposure is performed by controlling an exposure amount applied to a photosensitive resin 23 arranged on a metal film 22, and development is performed to the photosensitive resin 23, and thus a resist 25 provided with an edge section 25b having a tilted surface 25a having a tilt angle α of at least 20° but no more than 60° is formed. Then, a metal wiring is formed by etching the metal film 22 by using the resist 25 as a mask.

7 Claims, 6 Drawing Sheets

METHOD FOR MANUFACTURING DISPLAY DEVICE

TECHNICAL FIELD

The present invention relates to a method for manufacturing a display device, such as a liquid crystal display device, by superposing a pair of substrates on each other with a prescribed spacing between them and encapsulating liquid crystal in the gap between the pair of substrates.

BACKGROUND ART

Liquid crystal display devices, which are one of the display devices, have been widely used in mobile devices, such as laptop computers and cellular phones, as well as in audio-visual devices, such as liquid crystal display televisions, because they are thin and light.

Generally, liquid crystal display devices are provided with a pair of substrates provided facing each other (namely, an active matrix substrate and an opposite substrate), a liquid crystal layer provided between the pair of substrates, and a sealing material provided in a frame shape to adhere the pair of substrates to each other and encapsulate liquid crystal between the two substrates.

Also, as such liquid crystal display devices, there are active matrix liquid crystal display devices, for example, which are provided with an active element, such as a TFT (Thin Film Transistor), corresponding to each pixel area, and connect a wiring that is provided on an insulating substrate, such as a glass substrate, to a pixel electrode that is provided on each pixel area through the aforementioned active element. These active matrix liquid crystal display devices are configured such that the wiring and the pixel electrode are connected through the active element provided between them, and that a potential applied from the wiring to the pixel electrode is controlled by the active element.

Here, in liquid crystal display devices, a prescribed pattern structure needs to be formed in order to form the wiring, pixel electrode or the like. However, patterning errors may occur while forming this pattern structure.

For example, when manufacturing an active matrix substrate provided with a plurality of switching elements, first, as shown in FIG. 16, an interlayer insulating film 102 is formed on an insulating substrate 100 on which switching elements (not shown in the figure) and a metal wiring 101 are formed.

Then, as shown in FIG. 17, a pixel electrode material 103 made of ITO (Indium Tin Oxide), for example, is formed on the entire insulating substrate 100 on which the metal wiring 101 and the interlayer insulating film 102 are formed.

Next, as shown in FIG. 18, a photosensitive resin 104 is disposed on the pixel electrode material 103. Then, as shown in FIG. 19, a resist 105 having a prescribed pattern is formed by exposing and developing this photosensitive resin 104.

Here, as shown in FIG. 18, because shapes corresponding to edge sections 101a on both widthwise ends of the metal wiring 101 on the lower layer appear as is on the photosensitive resin 104, light may be scattered at the edge sections 104a of the photosensitive resin 104 while the photosensitive resin 104 applied on the pixel electrode material 103 undergoes exposure, causing the exposure amount applied to the photosensitive resin 104 to be insufficient. As a result, the photosensitive resin 104 is not removed completely on the edge sections 104a of the photosensitive resin 104, leaving a residue 106 of the resist 105, as shown in FIG. 19.

Next, using the resist 105 as a mask, a pixel electrode 107 having a prescribed pattern is formed by etching. Here, because the residue 106 of the resist 105 is formed, the pixel electrode in aforementioned edge sections is not removed by etching, as shown in FIG. 20, resulting in a residue 108 of the pixel electrode 107. Thus, on edge sections 102a of the interlayer insulating film 102 where, by design, the pixel electrode 107 should have been removed, the pixel electrode 107 is not removed, and a residue 108 of the pixel electrode 107 is left in regions where the prescribed pattern is not formed, causing a so-called film residue. As a result, there has been a problem of the residue 108 electronically connecting adjacent pixels, causing an electrical short-circuit (leakage) and display anomalies, which significantly lower the display quality.

Therefore, methods for preventing a short-circuit between pixels and eliminating display anomalies have been suggested. More particularly, for example, there has been disclosed a method by which a pixel electrode is provided to form a film on a thin film that has been patterned into a prescribed shape on a transparent insulating substrate, and then, the pixel electrode is etched into a prescribed shape by performing dry etching using an ion beam milling method, where the ion beam incident angle is changed in two steps. It is disclosed that, by shifting between two ion beam incident angles, a film residue on an edge section of steps on the lower layer can be protected, and a short-circuit between pixels can be prevented, thereby improving the display quality (see Patent Document 1 for example).

RELATED ART DOCUMENT

Patent Document

Patent Document 1: Japanese Patent Application Laid-Open Publication No. H6-318577

SUMMARY OF THE INVENTION

Problems to be Solved by the Invention

In the abovementioned conventional method, however, even when the ion beam incident angle is shifted between two angles, it is difficult to etch the edge section of the steps in the lower layer completely because it is difficult for the ion beam to reach the edge section of the steps in the lower layer. Therefore, because it is difficult to effectively prevent a residue of the pixel electrode from forming, there has been, after all, a problem of a film residue forming and of an electrical short-circuit (leakage) between adjacent pixels occurring due to the film residue, causing display anomalies.

Accordingly, the present invention seeks to address the problems described above. The aim of the present invention is to provide a method for manufacturing a display device that prevents display anomalies due to an electrical short-circuit (leakage) from occurring by preventing a film residue of the pixel electrode from forming.

Means for Solving the Problems

In order to fulfill the aim above, the display device manufacturing method of the present invention is a method for manufacturing a display device having an active matrix substrate on which a plurality of switching elements are provided in a matrix and an opposite substrate that is placed facing the active matrix substrate through a display medium layer, and includes at least a step of preparing an insulating substrate for the active matrix substrate; a step of forming a metal film on the insulating substrate; a step of providing a photosensitive resin on the metal film; a step of exposing the photosensitive resin by controlling the exposure amount applied to the photosensitive resin; a step of forming a resist that is provided with an edge section having a tilted surface with a tilt angle of at least 20° but no more than 60° by developing the photosensitive resin; a step of forming a metal wiring by etching the metal film using the resist as a mask; a step of forming an interlayer insulating film material on the insulating substrate on which the metal wiring has been formed; a step of forming an interlayer insulating film on the metal wiring by exposing and developing the interlayer insulating film material using a photomask; a step of forming a pixel electrode material on the insulating substrate on which the interlayer insulating film has been formed; a step of forming another resist by providing another photosensitive resin on the pixel electrode material and by exposure and development; and a step of forming a pixel electrode that is electrically connected to the switching elements by etching using the another resist as a mask.

According to this configuration, the resist provided with an edge section having a tilted surface with a tilt angle of at least 20° but no more than 60° is formed by exposing the photosensitive resin provided on the metal film by controlling the exposure amount applied to the photosensitive resin and by developing the photosensitive resin. Therefore, an edge section of the metal wiring, which is formed by etching the metal film using the resist as a mask, becomes gently tilted. Because of this, an edge section of the interlayer insulating film, which is formed on the metal wiring, as well as an edge section of the pixel electrode material, which is formed on the interlayer insulating film, becomes gently tilted. Therefore, when another resist for patterning the pixel electrode material is being formed by providing another photosensitive resin on the pixel electrode material by exposure and development, a residue of the another resist can be prevented from forming on the edge section of the pixel electrode material. Therefore, a residue of the pixel electrode can be prevented from forming on the edge section of the interlayer insulator film. As a result, because an electrical short-circuit (leakage) between adjacent pixels can be prevented, display anomalies can be prevented from occurring and the display quality of the display device can be prevented from lowering.

Furthermore, in the display device manufacturing method of the present invention, exposure may be performed using a gray-tone mask or a half-tone mask.

According to the same configuration, because exposure with different exposure amounts can easily be performed on the photosensitive resin, the exposure amount applied to the photosensitive resin is easily controlled.

Furthermore, the display device manufacturing method of the present invention is suited to a method for manufacturing a display device that uses a liquid crystal layer as a display medium layer. In addition, the display device manufacturing method of the present invention is suited to a method for manufacturing a display device where the pixel electrode is made of indium tin oxide or indium zinc oxide. In addition, the display device manufacturing method of the present invention is suited to a method for manufacturing a display device, where the switching element is a thin film transistor.

Effects of the Invention

According to the present invention, because an electric short-circuit (leakage) between adjacent pixels can be prevented from occurring, display anomalies can be prevented from occurring, and lowering of the display quality of the display device can be prevented.

DETAILED DESCRIPTIONS OF EMBODIMENT

The configuration and the manufacturing method of the display device according to an embodiment of the present invention are described below in detail with reference to the drawings. In addition, in this embodiment, a liquid crystal display device is used as an example of a display device. However, the present invention is not limited to the embodiment below.

Figure 1:
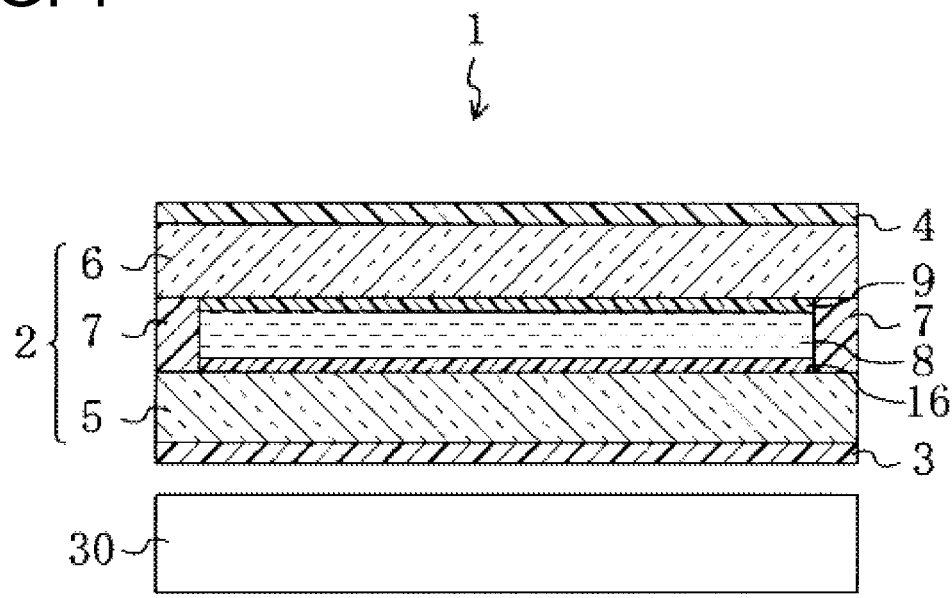
FIG. 1 is a cross-sectional view showing the entire configuration of the liquid crystal display device according to an embodiment of the present invention.
Figure 2:
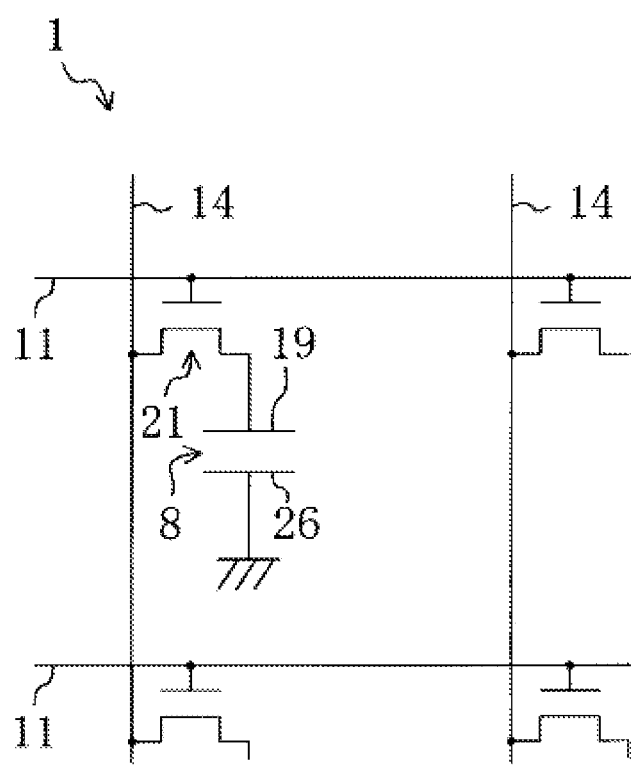
FIG. 2 is an equivalent circuit diagram of the liquid crystal display device according to an embodiment of the present invention.
Figure 3:
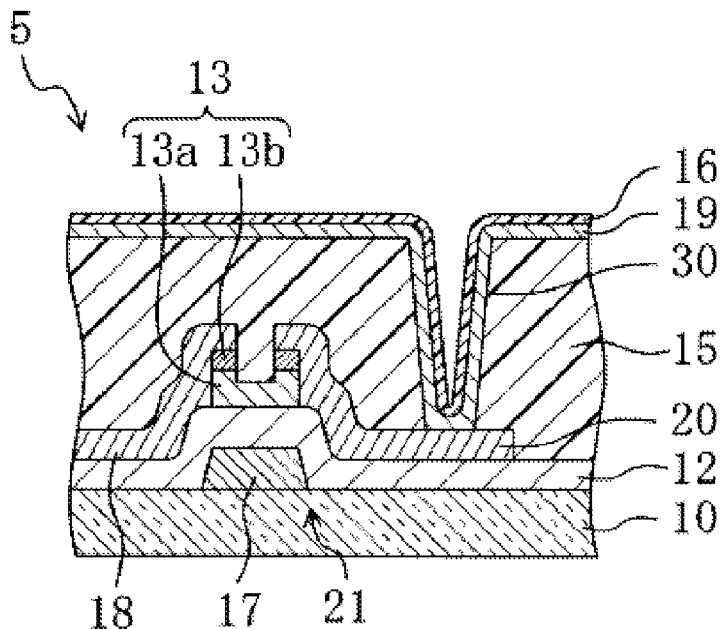
FIG. 3 is a cross-sectional view showing the entire configuration of a thin film transistor substrate constituting the liquid crystal display device according to an embodiment of the present invention.

FIG. 1 is a cross-sectional view showing the overall configuration of a liquid crystal display device according to an embodiment of the present invention, and FIG. 2 is an equivalent circuit diagram of a liquid crystal display device of the embodiment of the present invention. In addition, FIG. 3 is a cross-sectional view showing the overall configuration of the thin film transistor substrate constituting the liquid crystal display device of the embodiment of the present invention.

As shown in FIG. 1, a liquid crystal display device 1 includes a liquid crystal display panel 2 and a backlight 30.

The liquid crystal display panel 2 is provided with a thin film transistor substrate 5, which is an active matrix substrate with a polarizing plate 3 placed on the outer surface; a color filter substrate 6, which is an opposite substrate with a polarizing plate 4 placed on the outer surface; and a liquid crystal layer 8, which is a display medium layer placed between the two substrates and is surrounded by a sealing material 7 adhering the thin film transistor substrate 5 and the color filter substrate 6 together. Furthermore, the color filter substrate 6 is placed to face the thin film transistor substrate 5 through the liquid crystal layer 8.

The thin transistor substrate 5 is a substrate on which a plurality of switching elements are placed in a matrix. Specifically, as shown in FIGS. 2 and 3, the thin film transistor substrate 5 has an insulating substrate 10, such as a glass substrate; a plurality of gate lines 11 extending parallel to each other on the insulating substrate 10; and a gate insulating film 12, which is provided to cover the respective gate lines 11. In addition, the thin film transistor substrate 5 has a plurality of source lines 14 extending parallel to each other in a direction perpendicular to the respective gate lines 11 on the gate insulating film 12; and thin film transistors 21, which are a plurality of switching elements provided at respective intersections of the respective gate lines 11 and the respective source lines 14. Furthermore, the thin film transistor substrate 5 has an interlayer insulating film 15, which is provided to cover the respective source lines 14 and the respective thin film transistors 21; a plurality of pixel electrodes 19, which are placed in a matrix on the interlayer insulating film 15 and are respectively connected to the respective thin film transistors 21; and an alignment film 16, which is provided to cover the respective pixel electrodes 19. In addition, the respective rectangular areas demarcated by gate lines 11 and source lines 14 become pixel areas. Furthermore, the pixel electrode 19 is made of a transparent conductor, such as ITO (Indium Tin Oxide) or IZO (Indium Zinc Oxide).

Furthermore, the thin transistor substrate 5 has, as shown in FIG. 3, a gate electrode 17, which is a lateral projection of each gate line 11; a gate insulating film 12, which is provided to cover the gate electrode 17; and a semiconductor layer 13, which is in an island-shape and is provided on the gate insulating film 12 at places so as to overlap the gate electrode 17. Furthermore, the thin film transistor substrate 5 is provided with a source electrode 18 and a drain electrode 20 facing each other on the semiconductor layer 13. Here, the source electrode 18 is a part of each source line 14 projecting laterally. Furthermore, as shown in FIG. 3, the drain electrode 20 is connected to the pixel electrode 19 through a contact hall 30, which is formed in the interlayer insulating film 15. In addition, as shown in FIG. 3, the semiconductor layer 13 is provided with an intrinsic amorphous silicon layer 13a as a lower layer and an n$^+$ amorphous silicon layer 13b, which is doped with phosphorus, as an upper layer. Also, the intrinsic amorphous silicon layer 13a that is exposed from the source electrode 18 and the drain electrode 20 constitutes a channel region.

The color filter substrate 6 has an insulating substrate, such as a glass substrate (not shown in the figure); a color filter layer (not shown in the figure), which is provided on the insulating substrate; a common electrode 26, which is provided to cover the color filter layer; a photo spacer (not shown in the figure), which is provided in a columnar shape on the common electrode 26; and an alignment film 9, which is provided to cover the common electrode 26 and the photo spacer. In addition, the color filter layer includes colored layers corresponding to each pixel: a red layer R, a green layer G and a blue layer B; a colorless layer W, which is used to form a reflective display unit; and a black matrix, which is a light-shielding film (respective layers not shown in the figure).

Furthermore, in the liquid crystal display device 1, each pixel electrode constitutes one pixel. Each pixel is configured such that, when a gate signal is sent from the gate line 11 and turns on the thin film transistor 21, a source signal is sent from the source line 14 through the source electrode 18 and the drain electrode 20 and a prescribed electric charge is written in the pixel electrode 19, creating a potential difference between the pixel electrode 19 and the common electrode 26. As a result, a prescribed voltage is applied to the liquid crystal layer 8. The liquid crystal display device 1 is configured such that an image is displayed by adjusting transmittance of the incident light from the backlight 30, using changes in the orientation of liquid crystal molecules depending on the applied voltage amount.

Next, a method for manufacturing the liquid crystal display device 1 according to an embodiment of the present invention is explained. FIGS. 4 to 15 are cross-sectional views explaining a method for manufacturing a thin film transistor substrate constituting a liquid crystal display device of the embodiment of the present invention. Here, the manufacturing method below is only an example, and the liquid crystal display device 1 of the present invention is not limited to those that are manufactured by the method below. The manufacturing method of this embodiment includes a step of preparing a thin film transistor substrate, a step of preparing a color filter substrate, and a step of adhering the substrates together.

Steps of Preparing a Thin Film Transistor Substrate

Figure 4:
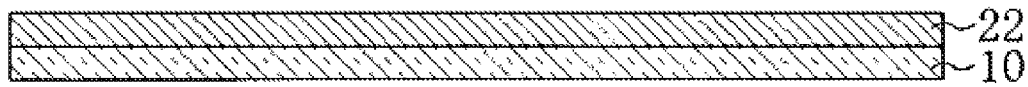
FIG. 4 is a cross-sectional view explaining a method for manufacturing the thin film transistor substrate constituting the liquid crystal display device according to an embodiment of the present invention.

First, an insulating substrate 10, such as a glass substrate, which is a base for the thin film transistor substrate 5, is prepared. Then, as shown in FIG. 4, a metal film 22 is formed on the insulating substrate 10 by sputtering an aluminum alloy, for example.

Figure 5:
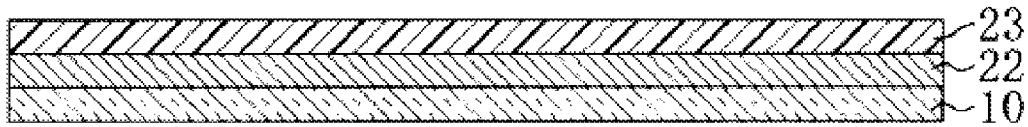
FIG. 5 is a cross-sectional view explaining a method for manufacturing the thin film transistor substrate constituting the liquid crystal display device according to an embodiment of the present invention.

Next, as shown in FIG. 5, a positive-type photosensitive resin 23 is applied on the metal film 22. Then, by exposing and developing the photosensitive resin 23 using a photomask 24, as shown in FIG. 6, a resist 25 having a prescribed pattern is formed, as shown in FIG. 7.

Figure 6:
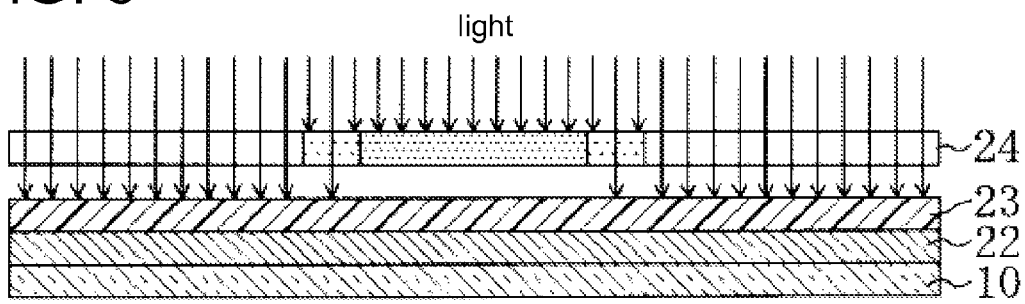
FIG. 6 is a cross-sectional view explaining a method for manufacturing the thin film transistor substrate constituting the liquid crystal display device according to an embodiment of the present invention.
Figure 7:
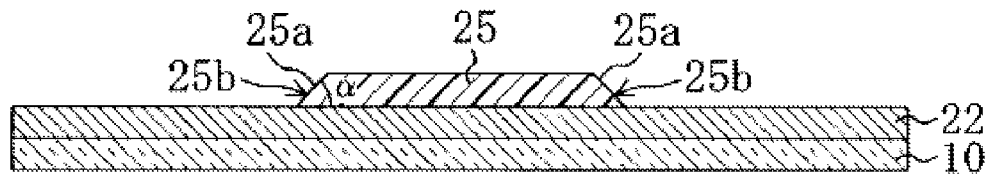
FIG. 7 is a cross-sectional view explaining a method for manufacturing the thin film transistor substrate constituting the liquid crystal display device according to an embodiment of the present invention.

Here, as shown in FIG. 6, this embodiment is configured so that the exposure amount applied to the photosensitive resin 23 is controlled by performing an exposure using a half-tone mask or a gray-tone mask as the photomask 24. Therefore, this embodiment is characterized by using a half-tone mask or a gray-tone mask, which has different levels of light transmittance at places, as the photomask 24, and exposing the photosensitive resin 23 through the photomask 24. By performing such an exposure, the photosensitive resin 23 can be exposed with different exposure amounts. Therefore, by developing the photosensitive resin 23 that is exposed in such a manner, the resist 25 that is provided with an edge section 25b having a tilted surface 25a having a gently tilted angle α of at least 20° but no more than 60°, can be formed, as shown in FIG. 7.

Furthermore, in the exposure step, it is preferable that an exposure amount be set within the 40-65 mJ/cm² range, for example.

Figure 8:
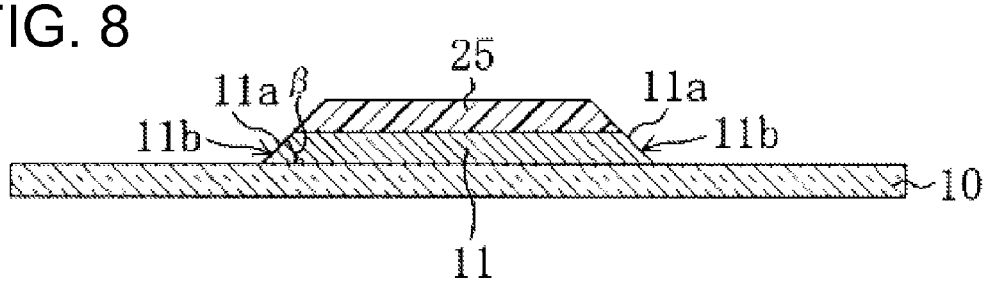
FIG. 8 is a cross-sectional view explaining a method for manufacturing the thin film transistor substrate constituting the liquid crystal display device according to an embodiment of the present invention.

Next, by dry etching the metal film 22 using the resist 25, which has been formed on the metal film 22, as a mask, the gate line 11, which is a metal wiring, is formed, as shown in FIG. 8.

Here, as mentioned above, the resist 25 is provided with an edge section 25b having a tilted surface 25a having a gently tilted angle α of at least 20° but no more than 60°. Therefore, the edge section 11b of the gate line 11, which is formed by etching the metal film 22 using the resist 25 as a mask, becomes gently tilted. More specifically, the edge section 11b of the metal wire 11 has a tilted surface 11a having a gently tilted angle β of at least 20° but no more than 60°. Furthermore, in this embodiment, the gate electrode 17 is formed at the same time as the gate line 11.

Figure 9:
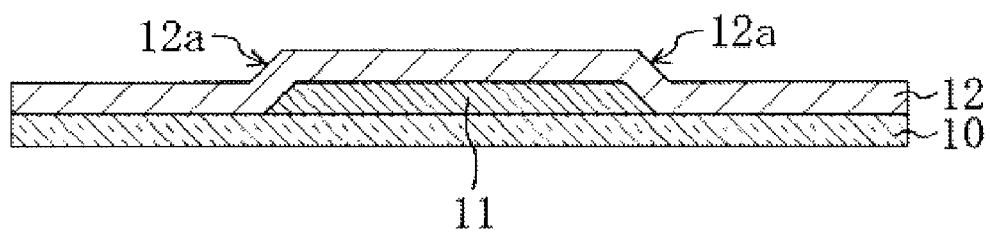
FIG. 9 is a cross-sectional view explaining a method for manufacturing the thin film transistor substrate constituting the liquid crystal display device according to an embodiment of the present invention.

Next, as shown in FIG. 9, after the resist 25 is removed, the gate insulating film 12 is formed by plasma CVD (Chemical Vapor Deposition) by forming a silicon nitride film or the like, for example, on the entire insulating substrate 10 on which the gate line 11 and the gate electrode 17 have been formed.

Here, as mentioned above, because the edge section 11b of the gate line 11 is gently tilted, an edge section 12a of the gate insulating film 12, which is formed on the gate line 11, also becomes gently tilted.

Next, on the entire insulating substrate 10 on which the gate insulating film 12 has been formed, an intrinsic amorphous silicon film (approximately 2000 Å thick) and an n⁺ amorphous silicon film (approximately 500 Å thick), which is doped with phosphorus, for example, are formed continuously by plasma CVD (Chemical Vapor Deposition). Then, a semiconductor formation layer, which is a multilayer of the laminated intrinsic amorphous silicon layer and the n⁺ amorphous silicon layer, is formed by patterning them into an island-shape by photolithography over the gate electrode 17.

Then, on the entire insulating substrate 10 on which the abovementioned semiconductor formation layer is formed, an aluminum film and a titanium film and the like, for example, are formed in that order by sputtering. Then, the source line 14, the source electrode 18, and the drain electrode 20 are formed by patterning them by photolithography.

Then, a channel region is patterned by etching the n⁺ amorphous silicon layer of the abovementioned semiconductor formation layer using the source electrode 18 and the drain electrode 20 as masks, and the semiconductor layer 13 and a thin film transistor 21 provided with the semiconductor layer 13 are formed.

Figure 10:
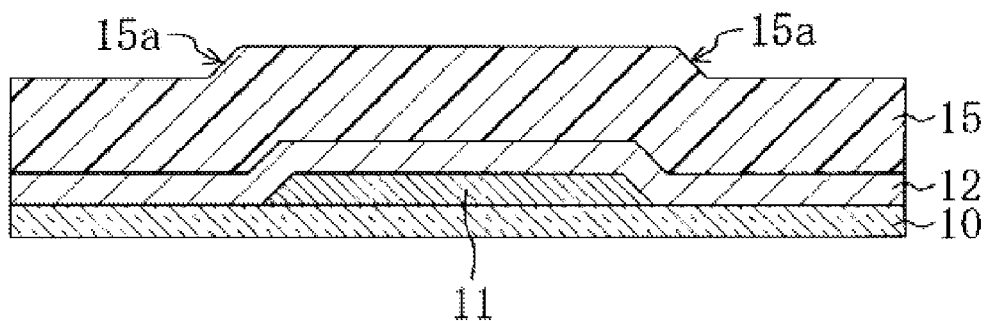
FIG. 10 is a cross-sectional view explaining a method for manufacturing the thin film transistor substrate constituting the liquid crystal display device according to an embodiment of the present invention.

Then, on the entire insulating substrate 10 on which the gate line 11 and the thin film transistor 21 have been formed, a positive-type photosensitive resin, for example, which is an interlayer insulating film material, is applied through spin coating. Then, by exposing and developing the photosensitive resin using a photomask, the interlayer insulating film 15 is formed over the gate line 11 through the gate insulating film 12, as shown in FIG. 10.

Here, as mentioned above, because the edge section 11b of the gate line 11 is gently tilted, an edge section 15a of the interlayer insulating film 15, which is formed on the gate line 11, also becomes gently tilted. In addition, in this embodiment, a contact hole 30 for connecting the drain electrode 20 and the pixel electrode 19 is formed at this time.

Figure 11:
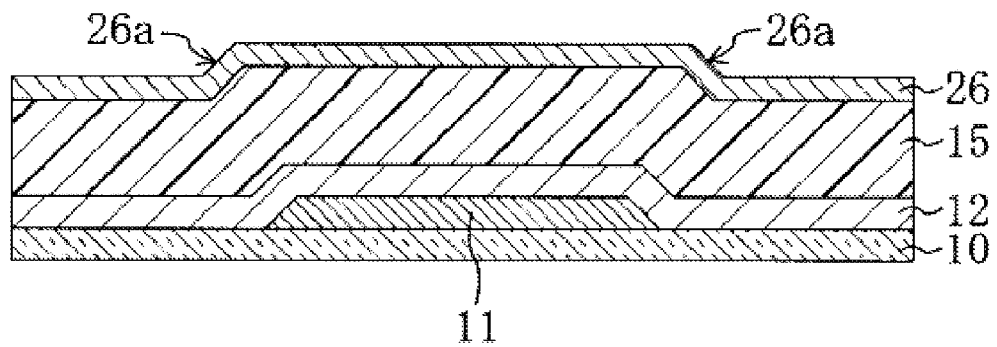
FIG. 11 is a cross-sectional view explaining a method for manufacturing the thin film transistor substrate constituting the liquid crystal display device according to an embodiment of the present invention.

Next, as shown in FIG. 11, ITO (Indium Tin Oxide) 26 is applied to form a film as a pixel electrode material by sputtering on the entire insulating substrate 10 on which the interlayer insulating film 15 has been formed.

Here, as mentioned above, because the edge section 15a of the interlayer insulating film 15 is gently tilted, an edge section 26a of the ITO 26, which is formed on the interlayer film 15, also becomes gently tilted.

Figure 12:
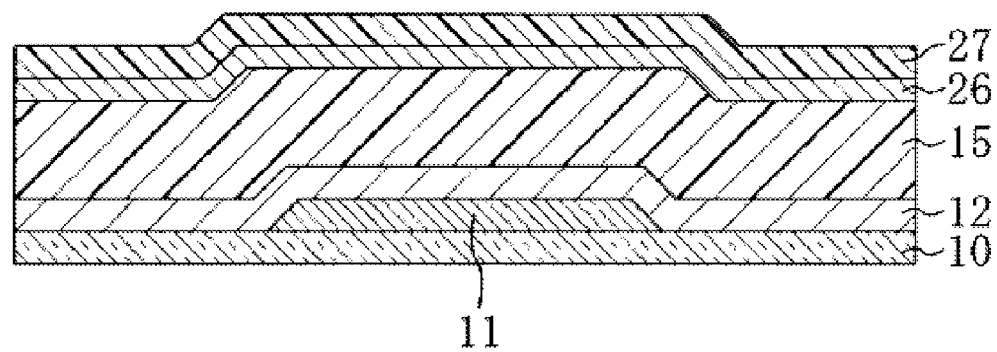
FIG. 12 is a cross-sectional view explaining a method for manufacturing the thin film transistor substrate constituting the liquid crystal display device according to an embodiment of the present invention.
Figure 13:
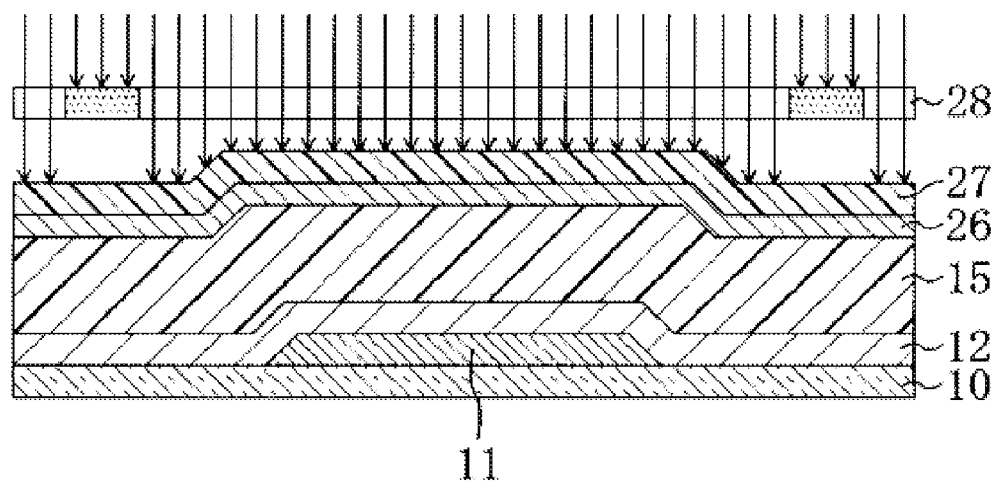
FIG. 13 is a cross-sectional view explaining a method for manufacturing the thin film transistor substrate constituting the liquid crystal display device according to an embodiment of the present invention.
Figure 14:
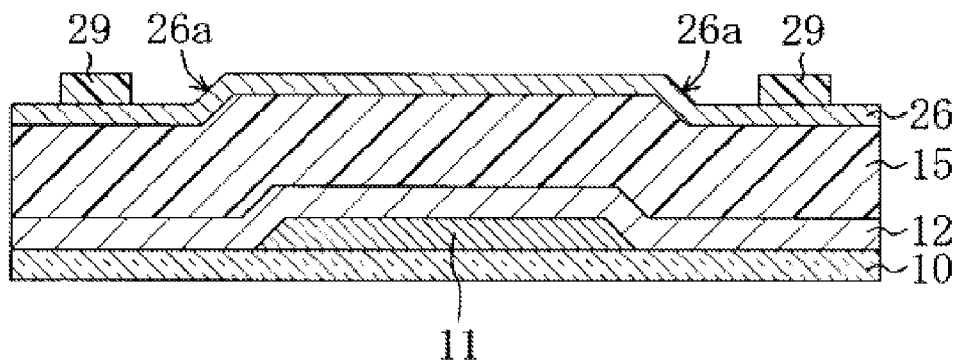
FIG. 14 is a cross-sectional view explaining a method for manufacturing the thin film transistor substrate constituting the liquid crystal display device according to an embodiment of the present invention.

Next, as shown in FIG. 12, a positive-type photosensitive resin 27, which is another photosensitive resin, is applied on the ITO 26. Then, as shown in FIG. 13, by exposing and developing the photosensitive resin 27 using a photomask 28, a resist 29, which is another resist having a prescribed pattern, is formed, as shown in FIG. 14.

Here, as mentioned above, because the edge section 26a of the ITO 26 is gently tilted, the exposure amount applied to the photosensitive resin 27 formed on the edge section 26a of the ITO 26 can be prevented from decreasing when the photosensitive resin 27 is exposed using the photomask 28. Therefore, the photosensitive resin 27 that is formed on the edge sections 26a of the ITO 26 can be completely removed by developing the photosensitive resin. As a result, as shown in FIG. 14, by applying the photosensitive resin 27 on the ITO 26, then exposing and developing it, a residue of the resist 29 can be prevented from forming on the edge section 26a of the ITO 26 when the resist 29 for patterning the ITO 26 is formed.

Figure 15:
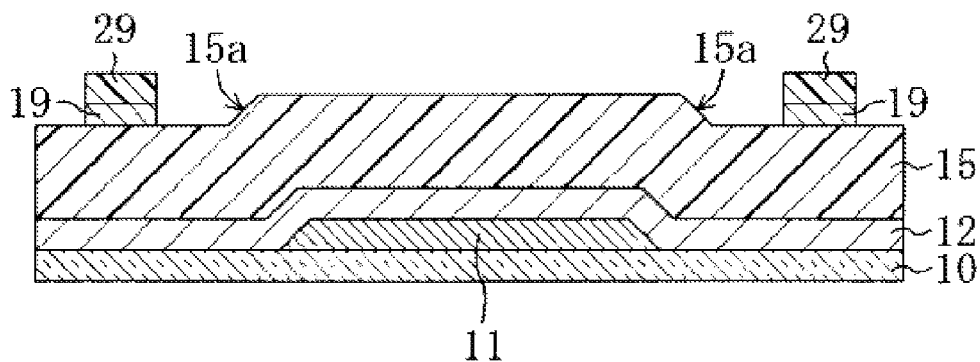
FIG. 15 is a cross-sectional view explaining a method for manufacturing the thin film transistor substrate constituting the liquid crystal display device according to an embodiment of the present invention.
Figure 16:
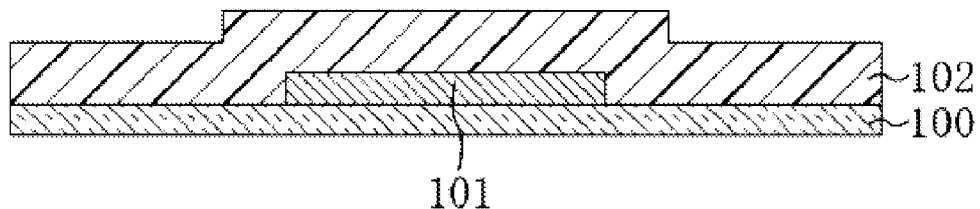
FIG. 16 is a cross-sectional view explaining a method for manufacturing a thin film transistor substrate constituting a conventional liquid crystal display device.
Figure 17:
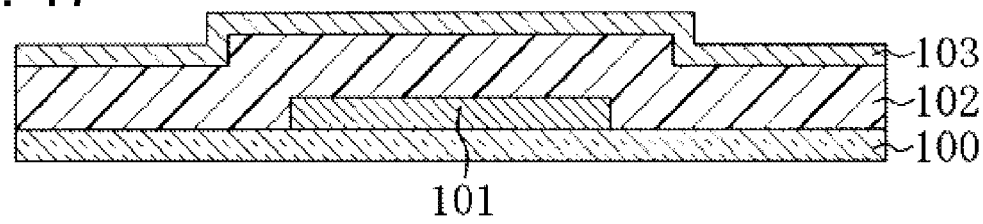
FIG. 17 is a cross-sectional view explaining a method for manufacturing a thin film transistor substrate constituting the conventional liquid crystal display device.
Figure 18:
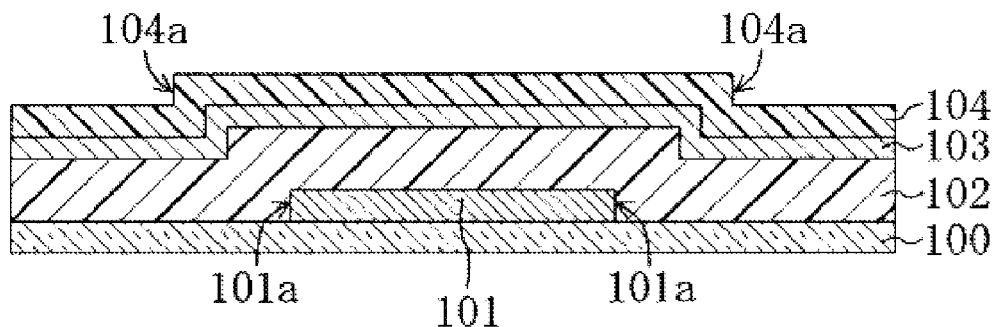
FIG. 18 is a cross-sectional view explaining a method for manufacturing a thin film transistor substrate constituting the conventional liquid crystal display device.
Figure 19:
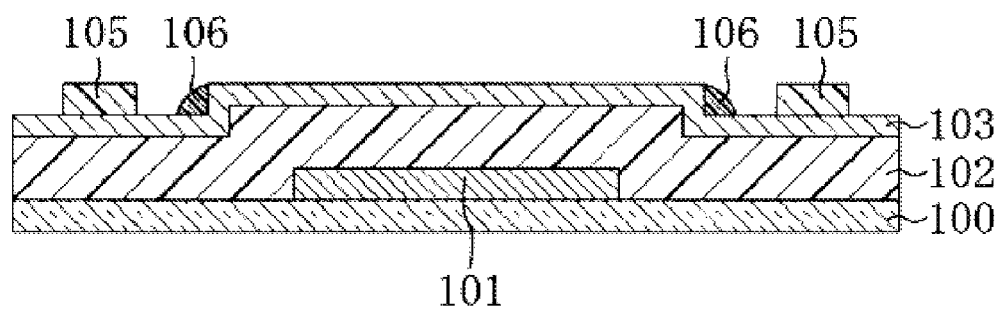
FIG. 19 is a cross-sectional view explaining a method for manufacturing a thin film transistor substrate constituting the conventional liquid crystal display device.
Figure 20:
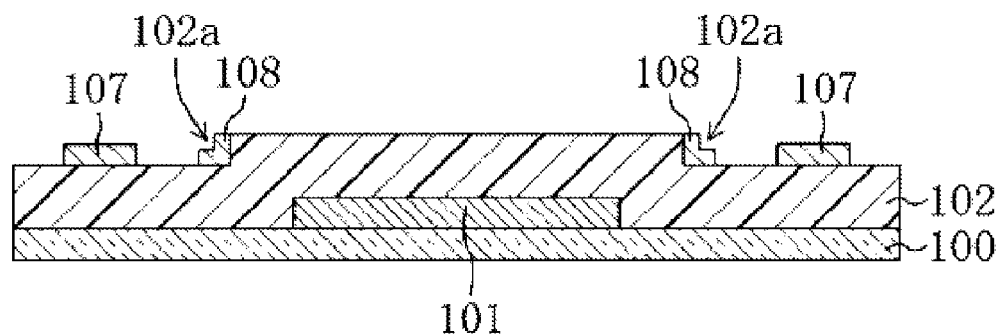
FIG. 20 is a cross-sectional view explaining a method for manufacturing a thin film transistor substrate constituting the conventional liquid crystal display device.

Then, as shown in FIG. 15, by wet etching the ITO 26 using the resist 29 formed on the ITO 26 as a mask, unnecessary ITO 26 is removed to form a pixel electrode 19, which is electrically connected to the thin film transistor 21 through the contact hole 30.

Here, as mentioned above, because there is no residue of the resist 29 left on the edge section 26a of the ITO 26, the pixel electrode 19 is patterned accurately on the interlayer insulating film 15, and a residue of the pixel electrode 19 can be prevented from forming on the edge section 15a of the interlayer insulating film 15. As a result, an electrical short-circuit (leakage) between adjacent pixels can be prevented from occurring.

Next, after the photosensitive resist is removed, a polyimide resin is applied by a printing method on the entire substrate on which the pixel electrode 19 has been formed. Then, an alignment film 16 is formed through a rubbing treatment.

The thin film transistor substrate can be manufactured as described above.

Steps of Preparing a Color Filter Substrate

First, a positive-type photosensitive resin in which black pigments, such as carbon particulates, for example, are dispersed is applied through spin coating on an entire substrate of an insulating substrate, such as a glass substrate. Then, after the applied photosensitive resin is exposed through a photomask, a black matrix is formed by developing and heating the applied photosensitive resin.

Then, a photosensitive acrylic resin that is colored red, green or blue, for example, is applied on the substrate on which the black matrix has been formed. Then, the applied photosensitive resin is patterned by exposing it through a photomask and developing it, thereby forming a colored layer of a color chosen (a red layer R, for example). In addition, colored layers of the other two colors (a green layer G and a blue layer B, for example) are formed by repeating the same step for respective colors to thereby form a color filter layer provided with the red layer R, the green layer B, and the blue layer B.

Next, an ITO film, for example, is formed through sputtering on the entire substrate having the color filter layer formed therein. Then, a common electrode 26 is formed by patterning the ITO film by photolithography.

Then, a photosensitive acrylic resin is applied through spin coating on the entire substrate on which the common electrode 26 has been formed. Then, a photo spacer is formed by exposing the applied photosensitive resin through a photomask and developing it.

Lastly, a polyimide resin is applied by a printing method on the entire substrate on which the photo spacer has been formed. Then, an alignment film 9 is formed through a rubbing treatment.

The color filter substrate 6 can be prepared by following the steps above.

Steps of Adhering the Substrates Together

First, using a dispenser, for example, a sealing material 7 that is made of an ultraviolet curing resin combined with a thermosetting resin and the like is drawn into a frame shape on the color filter substrate 6, which was prepared in the abovementioned step of preparing a color filter substrate.

Then, a liquid crystal material is drip-injected into the region inside the sealing material 7 on the color filter substrate 6 on which the abovementioned sealing material 7 is drawn.

In addition, the color filter substrate 6, in which the abovementioned liquid crystal material has been drip-injected, and the thin film transistor substrate 5, which was prepared in the abovementioned step for preparing the thin film transistor substrate, are adhered together under reduced pressure, and then, the top surface and the bottom surface of the resulting unit are pressured by placing the unit in atmospheric pressure.

Then, after the sealing material 7, which has been placed between the two substrates of the abovementioned adhered unit, is irradiated with an ultraviolet light, the sealing material 7 is cured by heating the adhered unit.

As described above, a liquid crystal display panel 2 is manufactured by placing the prepared thin film transistor substrate 5 and color filter substrate 6 to face each other with a spacer between them, adhering them together with the sealing material 7, and encapsulating a liquid crystal material between the two substrates.

Next, polarization plates 3 and 4 are respectively placed on both sides of the liquid crystal display panel 2 in the thickness direction, and a driver circuit as well as the backlight 30 are provided.

The liquid crystal display device 1 shown in FIG. 1 can be manufactured by the steps described above.

According to this embodiment described above, the following effects can be obtained.

This embodiment is configured so that the resist 25 provided with the edge section 25b having the tilted surface 25a having the tilt angle α of at least 20° but no more than 60° is formed by exposing the photosensitive resin 23, which is provided on the metal film 22, by controlling the exposure amount applied to the photosensitive resin 23 and by developing the photosensitive resin 23. Therefore, the edge section 11b of the gate line 11, which is formed by etching the metal film 22 using the resist 25 as a mask, becomes gently tilted. Because of this, the edge section 15a of the interlayer insulating film 15, which is formed on the gate line 11, as well as the edge section 26a of the ITO 26, which is formed on the interlayer insulating film 15, become gently tilted. Therefore, by providing the photosensitive resin 27 on the ITO 26, exposing and developing it, a residue of the resist 29 can be prevented from forming on the edge section 26a of the ITO 26 when the resist 29 for patterning the ITO 26 is formed. Therefore, the pixel electrode 19 is patterned accurately on the interlayer insulating film 15, and a residue of the pixel electrode 19 can be prevented from forming on the edge sections 15a of the interlayer insulating film 15. As a result, because an electrical short-circuit (leakage) between adjacent pixels can be prevented, display anomalies can be prevented from happening and lowering of the display quality of the liquid crystal display device 1 can be prevented.

This embodiment is configured so that the photosensitive resin 23 is exposed using a half-tone mask or a gray-tone mask as the photomask 24. Therefore, because the photosensitive resin 23 can be easily exposed with different exposure amounts, the exposure amount applied to the photosensitive resin 23 can be easily controlled.

Here, while this embodiment was explained using a liquid crystal display device as an example of a display device, the present invention can be applied in display devices related to, for example, organic EL (organic electro luminescence), inorganic EL (inorganic electro luminescence), electrophoretic, PD (plasma display), PALC (plasma addressed liquid crystal display), FED (field emission display), SED (surface-conduction electron-emitter display), or the like.

INDUSTRIAL APPLICABILITY

As explained above, the present invention is suited to a method for manufacturing a display device, such as a liquid crystal display device, in which a pair of substrates are superposed on each other with a prescribed spacing between them and liquid crystal is encapsulated in the gap between the pair of substrates.

DESCRIPTION OF REFERENCE CHARACTERS 1 liquid crystal display device
2 liquid crystal display panel
5 thin film transistor substrate (active matrix substrate)
6 color filter substrate (opposite substrate)
8 liquid crystal layer (display medium layer)
10 insulating substrate
11 gate line (metal wiring)
15 interlayer insulating film
19 pixel electrode
21 thin film transistor (switching element)
22 metal film
23 photosensitive resin
25 resist
25a tilted surface of the resist
25b edge section of the resist
26 ITO (pixel electrode material)
27 photosensitive resin (another photosensitive resin)
29 resist (another resist)
α tilt angle
β tilt angle

The invention claimed is:

1. A method for manufacturing a display device having an active matrix substrate on which a plurality of switching elements are provided in a matrix and an opposite substrate that is placed facing said active matrix substrate through a display medium layer, the method comprising:

preparing an insulating substrate for said active matrix substrate;

forming a metal film on said insulating substrate;

providing a photosensitive resin on said metal film;

exposing said photosensitive resin by controlling an exposure amount applied to said photosensitive resin;

forming a resist having an edge section having a tilted surface with a tilt angle of at least 20° but no more than 60° by developing said photosensitive resin;

forming a metal wiring by etching said metal film using said resist as a mask, the metal wiring having an edge section having a tilted surface with a tilted angle of at least 20° but no more than 60°;

forming an interlayer insulating film material on said insulating substrate on which said metal wiring has been formed;

forming an interlayer insulating film on said metal wiring by exposing and developing said interlayer insulating film material using a photomask, the interlayer insulating film having an inclined surface section substantially reflecting the tilted surface of the edge section of the metal film;

forming a pixel electrode material on said insulating substrate on which said interlayer insulating film has been formed;

forming another resist by providing another photosensitive resin on said pixel electrode material and by exposing and developing the another photosensitive resin; and forming a pixel electrode that is electrically connected to said switching elements by etching said pixel electrode material using said another resist as a mask, wherein the pixel electrode is present adjacent to the inclined surface section of the interlayer insulating film, and is absent on the inclined surface section of the interlayer insulating film.

2. The method for manufacturing a display device according to claim 1, wherein said exposure is performed using a gray-tone mask or a half-tone mask.

3. The method for manufacturing a display device according to claim 1, wherein said display medium layer is a liquid crystal layer.

4. The method for manufacturing a display device according to claim 1, wherein said pixel electrode is made of indium tin oxide or indium zinc oxide.

5. The method for manufacturing a display device according to claim 1, wherein said switching elements are thin film transistors.

6. The method for manufacturing a display device according to claim 1, wherein in a plan view, the metal wiring is sandwiched by two of said pixel electrode that are placed adjacent to the metal wiring, and the metal wiring does not overlap either of the two of said pixel electrode.

7. The method for manufacturing a display device according to claim 1, wherein the display device includes a display region, and
wherein the pixel electrode and the metal wiring are in the display region.

* * * * *